(12) United States Patent
Chikarmane et al.

(10) Patent No.: US 7,741,219 B2
(45) Date of Patent: Jun. 22, 2010

(54) METHOD FOR MANUFACTURING A SEMICONDUCTOR DEVICE USING THE SELF ALIGNED CONTACT (SAC) PROCESS FLOW FOR SEMICONDUCTOR DEVICES WITH ALUMINUM METAL GATES

(75) Inventors: Vinay B. Chikarmane, Portland, OR (US); Yang Cao, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 355 days.

(21) Appl. No.: 11/824,475

(22) Filed: Jun. 29, 2007

(65) Prior Publication Data

US 2009/0004857 A1    Jan. 1, 2009

(51) Int. Cl.
*H01L 21/44* (2006.01)
(52) U.S. Cl. .............................. 438/677; 257/E21.476
(58) Field of Classification Search ................ 438/677; 257/E21.476
See application file for complete search history.

(56) References Cited

U.S. PATENT DOCUMENTS

| | | | |
|---|---|---|---|
| 6,083,828 A | 7/2000 | Lin et al. | |
| 7,091,610 B2 | 8/2006 | Bohr | |
| 2006/0032757 A1* | 2/2006 | Brevnov et al. | 205/205 |
| 2006/0223302 A1* | 10/2006 | Chang et al. | 438/622 |

OTHER PUBLICATIONS

Saito et al., "Electrochemical analysis of zincate treatments for Al and Al alloy films", Electrochimica Acta, 51 (2005) pp. 1017-1020.*
Delaunois, F et al., "Heat Treatment for Electroless Nickel-Boron Plating on Aluminum Alloys", *Surface and Coatings Technology* 160, (Mar. 4, 2002), pp. 239-248.

* cited by examiner

*Primary Examiner*—W. David Coleman
*Assistant Examiner*—Sonya D McCall-Shepard
(74) *Attorney, Agent, or Firm*—Caven & Aghevli LLC

(57) ABSTRACT

In one embodiment, a method, comprises forming a diffusion layer on a semiconductor substrate, forming a selectively deposited metal or metal alloy on an aluminum gate structure by removing an aluminum oxide layer from the aluminum gate structure and depositing a zinc layer on the aluminum gate structure by a zincating process, and selectively depositing a sacrificial metal or metal alloy cap on the aluminum gate layer by displacing the zinc layer. This embodiment enables the SAC process flow on devices with Aluminum gates.

7 Claims, 3 Drawing Sheets

METHOD FOR MANUFACTURING A SEMICONDUCTOR DEVICE USING THE SELF ALIGNED CONTACT (SAC) PROCESS FLOW FOR SEMICONDUCTOR DEVICES WITH ALUMINUM METAL GATES

BACKGROUND

The subject matter described herein relates generally to semiconductor processing, and to electroless plating of metal layers on aluminum metal gate transistors.

Access to and operation of semiconductor devices, such as, transistors, resistors, capacitors, and the like is typically provided by one or more contacts to the devices. As the density of circuits of semiconductor devices increases with each subsequent generation, device pitches shrink by an average of 20-50%, significantly increasing the risk of shorting the interconnect to source or drain (collectively referred to herein as the contact), to the Interconnect to the gate. The decrease in pitch necessitates a fix to the shorting phenomena between the interconnect to the source/drain to the interconnect to the gate (this will be referred to herein as contact to gate shorting).

Contact to gate shorting during the semiconductor device manufacturing will create a short circuit in the semiconductor device resulting in the loss of the entire die (yield loss). For example, a contact opening may be intended to permit access to a source/drain region of a semiconductor device. If a misalignment occurs during the semiconductor device manufacturing process, when the misaligned contact opening is filled with metallic material, the contact to the source/drain will form a short circuit to the contact to the Gate resulting in the loss of the entire chip.

Semiconductor device manufacturers have developed self-aligned contact (SAC) technology to alleviate these problems. Conventional (SAC) manufacturing processes involve forming a electrolessly deposited sacrificial metal or metal alloy cap layer on a copper gate, which is formed on a semiconductor substrate.

Some semiconductor devices use aluminum as a gate interconnect. Aluminum commonly forms a thin layer of aluminum oxide, which is a highly stable passivated surface. The layer of aluminum oxide inhibits the subsequent selective deposition of the sacrificial metals or metal alloys on the aluminum layer by electroless deposition. Therefore, it is not possible to implement a SAC flow on devices with Al gate interconnects. This shortcoming is addressed by this invention.

The disclosed embodiments will be better understood from a reading of the following detailed description, taken in conjunction with the accompanying Figures in the drawings in which.

Figure 1:
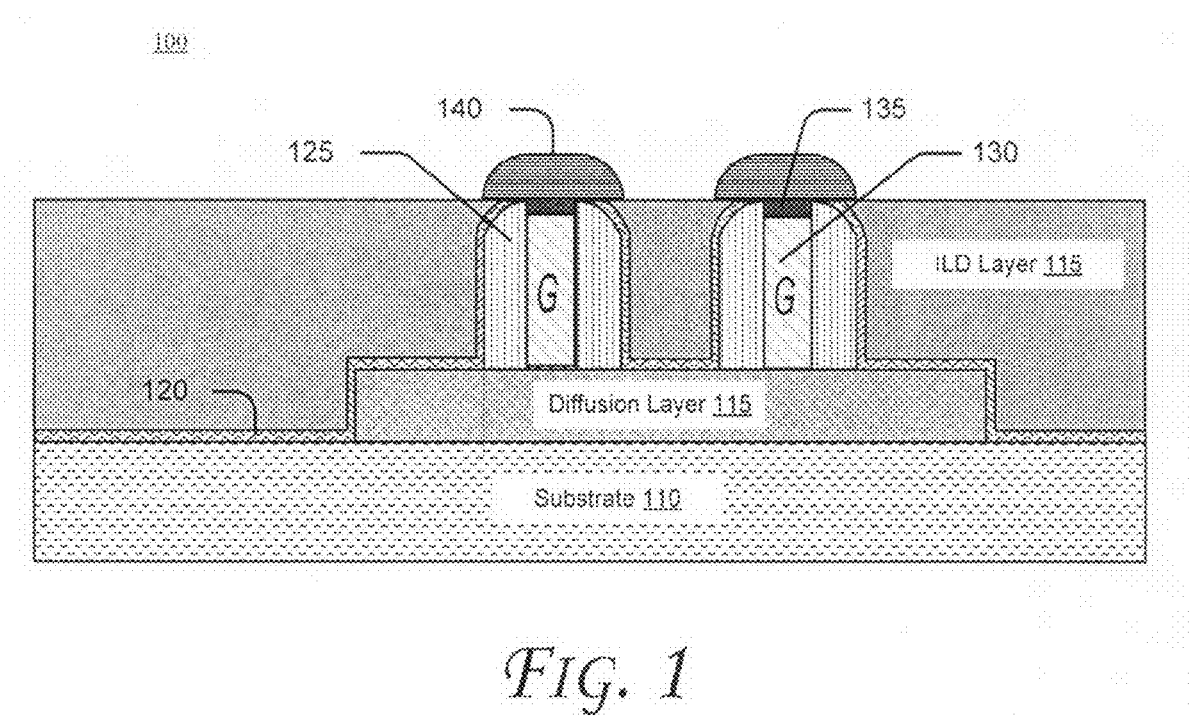
FIG. 1 is a schematic illustration of a semiconductor device, according to embodiments of the invention.

For simplicity and clarity of illustration, the drawing Figures illustrate the general manner of construction, and descriptions and details of well-known features and techniques may be omitted to avoid unnecessarily obscuring the discussion of the described embodiments of the invention. Additionally, elements in the drawing Figures are not necessarily drawn to scale. For example, the dimensions of some of the elements in the Figures may be exaggerated relative to other elements to help improve understanding of embodiments of the present invention. The same reference numerals in different Figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used.

DETAILED DESCRIPTION

FIG. 1 is a schematic illustration of a semiconductor device, according to embodiments of the invention. In the embodiment depicted in FIG. 1, the semiconductor device 100 comprises a substrate 110, a diffusion layer 115, a barrier layer 120. In the embodiment depicted in FIG. 1, two gate structures are illustrated.

In the embodiment depicted in FIG. 1, the gate structures comprise a gate 130 and spacers 125 adjacent the gate 130. A zinc layer 135 is disposed above the gate 130. The barrier layer 120 extends over the spacer 125. A metal layer 140 such as, for example, cobalt, nickel or alloys of Co or Ni resides above the zinc layer 135. The selectively electrolessly deposited metal or metal alloy layer 140 is a sacrificial layer.

Figure 2:
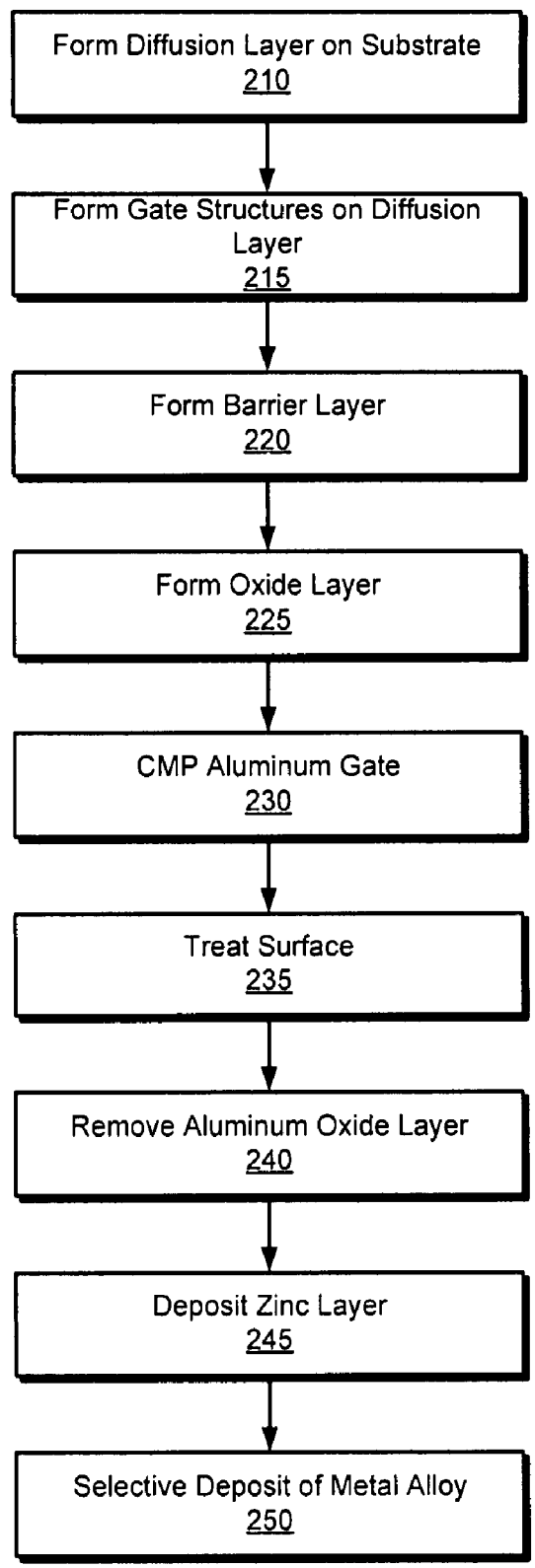
FIG. 2 is a flowchart illustrating operations in a method of forming a semiconductor device, according to embodiments of the invention.
Figure 3A:
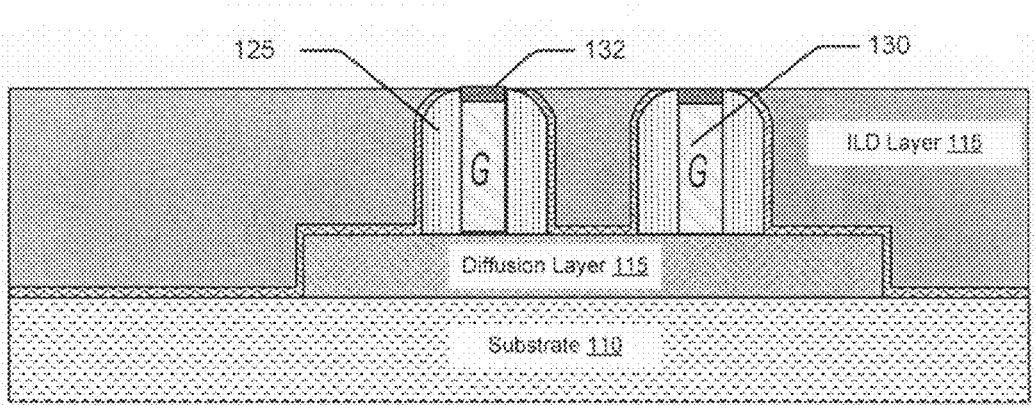
FIGS. 3A-3C are cross-sectional views of FIG. 1 at different points in its manufacturing process, according to embodiments of the invention.
Figure 3B:
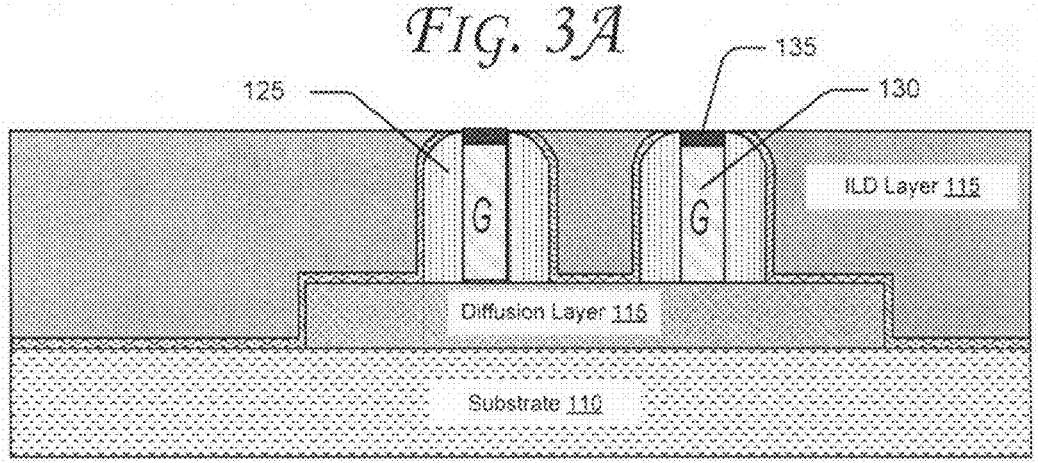
Figure 3C:
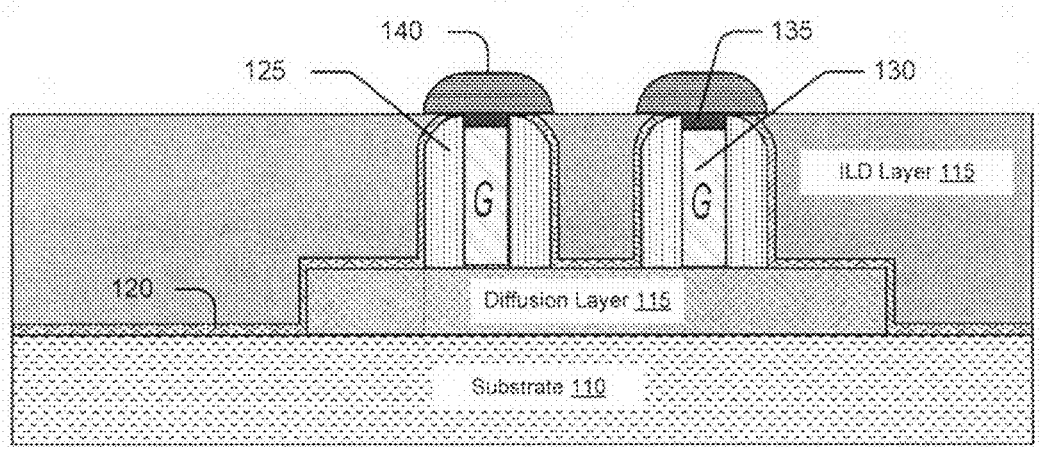

A method of making a semiconductor device, such as the semiconductor device 100 depicted in FIG. 1, will be explained with reference to FIGS. 2 and 3A-3C. FIG. 2 is a flowchart illustrating operations in a method of forming a semiconductor device, according to embodiments of the invention. FIGS. 3A-3C are cross-sectional views of the metallic micro-cantilever with an integral probe-tip of FIG. 1 at different points in its manufacturing process, according to embodiments of the invention.

Referring to FIG. 2, at operation 210 a diffusion layer 115 is formed on substrate 110. At operation 215, one or more gate structures are formed. The particular technique for constructing the gate structures is not critical to the subject matter of this application. The gate via or trench may be formed by a lithographic etching process and the aluminum metal may be deposited by a chemical vapor deposition process. One or more polishing or material removal processes may be implemented while the gates are being formed. At operation 220, a barrier layer 120 is formed. At operation 225, and oxide layer is formed on the surface of aluminum gates 125. As is known in the art, aluminum oxidizes naturally when exposed to air, thereby forming a highly stable passivated surface.

At operation 230 excess aluminum from forming the aluminum gate 130 may be removed, for example by a chemical-mechanical polishing (CMP) process. The Aluminum gate metal is now exposed to air. As is known in the art, aluminum oxidizes naturally when exposed to air, thereby forming a highly stable passivated surface. At operation 235 the surface of the wafer may be treated such that it remains in tact in a caustic condition, i.e., in conditions of high pH.

At operation 240 the layer of aluminum oxide 132 (FIG. 3A) is removed. In some embodiments, the aluminum oxide is removed with a zincating operation using a zincating solution consisting of $Z_nO_2$ having a pH that exceeds 14.8. At operation 245, a layer of zinc is deposited on the aluminum gates 130 (FIG. 3B).

At operation 250, a metal or metal alloy is selectively deposited onto the surface of the gates 130. In some embodiments, the metal or metal alloy may comprise a cobolt, nickel, or alloys of cobalt and nickel. The alloy may be deposited by a selective electroless metal deposition process. Selective electroless deposition of the metal or metal alloy will be activated by the zinc layer 135 disposed on gates 130.

Thus, the techniques described herein enable the selective deposition of a metallic layer on an aluminum gate interconnect. The selectively deposited metallic layer is a sacrificial layer used in subsequent processing operations. This is necessary in devices which include aluminum gate interconnects to enable the SAC process.

In the description and claims, the terms coupled and connected, along with their derivatives, may be used. In particular embodiments, connected may be used to indicate that two or more elements are in direct physical or electrical contact with each other. Coupled may mean that two or more elements are in direct physical or electrical contact. However, coupled may also mean that two or more elements may not be in direct contact with each other, but yet may still cooperate or interact with each other.

Reference in the specification to "one embodiment" "some embodiments" or "an embodiment" means that a particular feature, structure, or characteristic described in connection with the embodiment is included in at least an implementation. The appearances of the phrase "in one embodiment" in various places in the specification may or may not be all referring to the same embodiment.

Although embodiments have been described in language specific to structural features and/or methodological acts, it is to be understood that claimed subject matter may not be limited to the specific features or acts described. Rather, the specific features and acts are disclosed as sample forms of implementing the claimed subject matter.

What is claimed is:

1. A method of manufacturing a semiconductor device using the SAC process flow for semiconductor devices with aluminum metal gates, comprising:
   forming a diffusion layer on a substrate;
   forming one or more aluminum gate structures on the diffusion layer;
   forming a barrier layer on the gate structures;
   forming an oxide layer on the barrier layer;
   polishing the oxide layer and the barrier layer to expose portions of the one or more gate structures;
   removing an aluminum oxide layer from at least one aluminum gate structure by a zincating process;
   depositing a zinc layer on the aluminum gate structure; and
   then selectively depositing a metal or metal alloy on the aluminum layer using an electroless deposition technique catalyzed by the zinc layer.

2. The method of claim 1, wherein the zinc layer in turn is displaced by the selectively deposited electroless metal or metal, alloy.

3. The method of claim 1, wherein traces of zinc are left behind between the electrolessly deposited metal or metal alloy and aluminum gate.

4. The method of claim 1, wherein removing an aluminum oxide layer from the at least one gate structure comprises implementing a zincating process using a solution consisting of $Z_nO_2$ at a pH that exceeds 14.8.

5. The method of claim 1, wherein the zinc is deposited onto the aluminum gate metal through a displacement reaction.

6. The method of claim 1, wherein selectively depositing a metal or metal alloy on the zinc layer comprises an electroless metal deposition process.

7. The method of claim 1, wherein the zinc layer acts as a catalyst for the electroless metal deposition process.

* * * * *